United States Patent
Woo

(10) Patent No.: US 9,978,893 B2
(45) Date of Patent: May 22, 2018

(54) LAYERED BONDED STRUCTURES FORMED FROM REACTIVE BONDING OF ZINC METAL AND ZINC PEROXIDE

(71) Applicant: THE BOEING COMPANY, Chicago, IL (US)

(72) Inventor: Robyn L. Woo, Chicago, IL (US)

(73) Assignee: The Boeing Company, Chicago, IL (US)

( * ) Notice: Subject to any disclaimer, the term of this patent is extended or adjusted under 35 U.S.C. 154(b) by 311 days.

(21) Appl. No.: 14/791,119

(22) Filed: Jul. 2, 2015

(65) Prior Publication Data
US 2015/0303316 A1 Oct. 22, 2015

Related U.S. Application Data

(62) Division of application No. 13/471,306, filed on May 14, 2012, now Pat. No. 9,105,561.

(51) Int. Cl.
*B23K 31/02* (2006.01)
*H01L 31/0296* (2006.01)
(Continued)

(52) U.S. Cl.
CPC ............ *H01L 31/0296* (2013.01); *B23K 1/00* (2013.01); *H01L 21/187* (2013.01);
(Continued)

(58) Field of Classification Search
CPC ............ H01L 31/0296; H01L 31/0352; H01L 21/187; B23K 1/00; Y10T 428/31536; B32B 15/04
See application file for complete search history.

(56) References Cited

U.S. PATENT DOCUMENTS 3,392,312 A * 7/1968 Carman ................. C03C 3/064
257/794
5,907,903 A * 6/1999 Ameen ................. H01R 12/52
228/179.1
(Continued)

FOREIGN PATENT DOCUMENTS

GB 1306727 A * 2/1973 ............ C03C 8/245
JP 2002-531944 A 9/2002
(Continued)

OTHER PUBLICATIONS

First Office Action dated Nov. 28, 2016, in Chinese Patent Application No. 201310174108.8 (15pages).
(Continued)

*Primary Examiner* — Kiley Stoner
(74) *Attorney, Agent, or Firm* — Haynes and Boone, LLP

(57) ABSTRACT

A system, method, and apparatus for layered bonded structures formed from reactive bonding between zinc metal and zinc peroxide are disclosed herein. In particular, the present disclosure teaches a layered bonded structure wherein two structures are bonded together with a layer including zinc oxide. The zinc oxide is formed through a method that includes processing the two structures by contacting the structures under pressure and applying heat to the structures to promote a reaction with zinc peroxide and zinc metal on one or both of the two structures.

20 Claims, 2 Drawing Sheets

Figure 1:
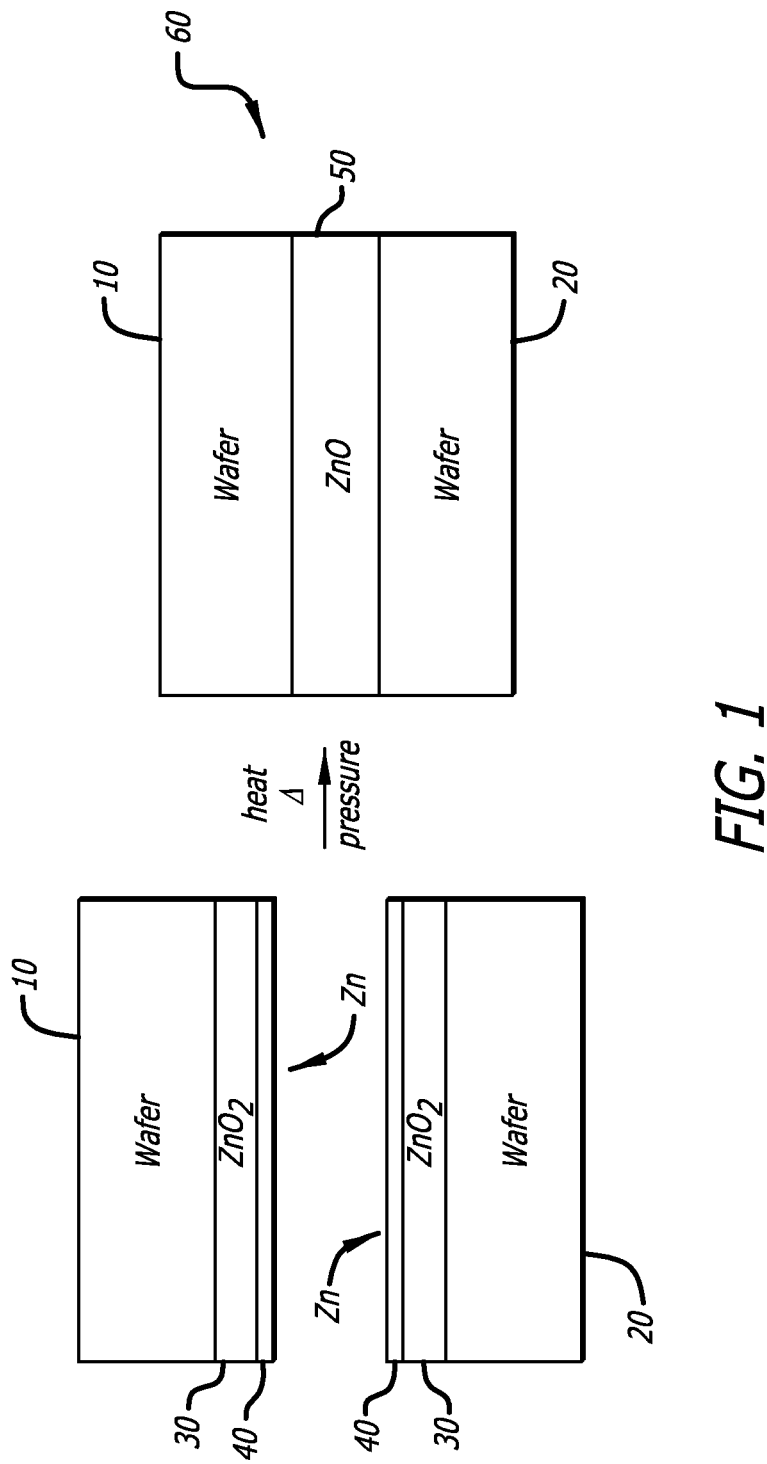

(51) Int. Cl.
  *B23K 1/00*      (2006.01)
  *H01L 21/18*     (2006.01)
  *H01L 31/0352*   (2006.01)
  *B32B 15/04*     (2006.01)
(52) U.S. Cl.
  CPC .......... *H01L 31/0352* (2013.01); *B32B 15/04* (2013.01); *Y10T 428/31536* (2015.04)

(56) References Cited

U.S. PATENT DOCUMENTS

| | | | | |
|---|---|---|---|---|
| 9,064,987 B2* | 6/2015 | Nakamura | ............ | G01J 1/0252 |
| 9,404,536 B2* | 8/2016 | Long | ................ | F03B 11/06 |
| 2002/0048900 A1 | 4/2002 | Lo et al. | | |
| 2003/0054661 A1 | 3/2003 | Stanbery | | |
| 2004/0149810 A1* | 8/2004 | Yang | ................ | H01L 33/641 |
| | | | | 228/175 |
| 2005/0266251 A1* | 12/2005 | Rita | ................ | B32B 15/04 |
| | | | | 428/432 |
| 2008/0169483 A1* | 7/2008 | Kasai | ................ | H01L 21/187 |
| | | | | 257/183 |
| 2010/0032008 A1* | 2/2010 | Adekore | ........... | B82Y 20/00 |
| | | | | 136/255 |
| 2010/0170936 A1 | 7/2010 | Tu et al. | | |
| 2010/0186813 A1* | 7/2010 | Knoll | ................ | H01L 31/046 |
| | | | | 136/256 |
| 2010/0193801 A1* | 8/2010 | Yamada | ............. | B23K 35/282 |
| | | | | 257/77 |
| 2010/0313943 A1* | 12/2010 | Knoll | ................ | H01L 31/0296 |
| | | | | 136/255 |
| 2010/0320444 A1* | 12/2010 | Dutta | ................ | H01L 25/042 |
| | | | | 257/21 |
| 2011/0039368 A1* | 2/2011 | Boussagol | .......... | C30B 25/18 |
| | | | | 438/93 |
| 2011/0127581 A1* | 6/2011 | Bethoux | ............. | H01L 21/187 |
| | | | | 257/201 |
| 2011/0132437 A1* | 6/2011 | Kost | ................ | C03C 27/08 |
| | | | | 136/251 |
| 2011/0171812 A1* | 7/2011 | Letertre | ............. | H01L 21/187 |
| | | | | 438/458 |
| 2011/0180688 A1* | 7/2011 | Nakahara | ......... | H01L 21/02425 |
| | | | | 250/208.1 |
| 2011/0316023 A1* | 12/2011 | Yeh | ................ | H01L 33/46 |
| | | | | 257/98 |
| 2013/0298972 A1* | 11/2013 | Lin | ................ | H01L 33/38 |
| | | | | 136/255 |

FOREIGN PATENT DOCUMENTS

| | | | | |
|---|---|---|---|---|
| WO | 00/33363 A1 | 6/2000 | | |
| WO | WO 2008093873 A1 * | 8/2008 | ............ | H01L 29/43 |
| WO | WO 2011162127 A1 * | 12/2011 | ........... | H01L 31/109 |

OTHER PUBLICATIONS

Extended European Search Report, EP Application No. 13163891.8-1555 / 2665088, dated May 8, 2014.
European Office Action, EP Application No. 13163891.8-1555, dated Nov. 4, 2016.
A. Murai, D. B. Thompson, C. Ye Chen, U. K. Mishra, S. Nakamura, and S. P. DenBaars, "Light-Emitting Diode Based on ZnO and GaN Direct Wafer Bonding", Japanese Journal of Applied Physics 45, pp. 1045-1047 (2006).
A. Murai, D. B. Thompson, H. Masui, N. Fellows, U. K. Mishra, S. Nakamura, and S. P. DenBaars, "Mega-cone blue LEDs based on ZnO/GaN direct wafer bonding," Physica Status Solidi (c) 4, No. 7, p. 2756-2759 (2007).
M. D. Barankin, E. Gonzalez II, A. M. Ladwig, and R. F. Hicks, "Plasma-enhanced chemical vapor deposition of zinc oxide at atmospheric pressure and low temperature," Solar Energy Materials & Solar Cells 91, p. 924-930 (2007).
R. Baca, G. Juarez, H. Solache, J. Andraca, J. Martinez, O. Garcia, T. Kryshtab, and R. Pena-Sierra, "Kinetics of the oxidation of Zn foils in air atmosphere," 2009 European Materials Research Society Spring Meeting, Symposium G, Materials Science and Engineering 8, p. 12043 (2010).
A. Veloso Maciel, W. da Nova Mussel, V. Marcia Duarte Pasa, "A novel synthesis of nanostructured ZnO via thermal oxidation by Zn nanowires obtained by a green route," Materials Sciences and Applications 1, p. 279-284 (2010).
S. Lindroos and M. Leskela, "Growth of zinc peroxide (ZnO2) and zinc oxide (ZnO) thin films by the successive ionic layer adsorption and reaction—SILAR—technique," International Journal of Inorganic Materials 2, p. 197-201 (2000).
Notice of Reasons for Rejection dated Mar. 7, 2017 in Japanese Patent Application No. 2013-101464 (4pages).

* cited by examiner

LAYERED BONDED STRUCTURES FORMED FROM REACTIVE BONDING OF ZINC METAL AND ZINC PEROXIDE

CROSS-REFERENCE TO RELATED APPLICATION

This application is a Divisional application of, and claims the benefit of, U.S. patent application Ser. No. 13/471,306, filed May 14, 2012, the entire disclosure of which is expressly incorporated by reference herein.

BACKGROUND

The invention is directed to bonding materials using reactive bonding of zinc peroxide and zinc metal to form zinc oxide.

SUMMARY

The present disclosure relates to a method, system, and apparatus for layered bonded structures formed from reactive bonding between zinc metal and zinc peroxide. In one or more embodiments, the present disclosure teaches a method of forming a bonded layered structure that includes providing a first structure and a second structure, forming layers with zinc metal and zinc peroxide on one or more of the first and second structures, processing the first and second structures to cause oxidation of the zinc metal, and forming another layer with zinc oxide between the first and second structures. In at least one embodiment, the zinc oxide is formed from oxidation of the zinc metal and deoxidation of zinc peroxide. In further embodiments, the oxidation results from oxygen provided by the zinc peroxide, as well as oxygen from ambient conditions.

In one or more embodiments, the present disclosure teaches a bonded layered structure that includes a first structure and a second structure and a layer comprising zinc oxide between the first and second structures, wherein the zinc oxide is formed from oxidation of zinc metal on at least one of the first and second structures. In at least one embodiment, the zinc oxide is formed from deoxidation of zinc peroxide on at least one of the first and second structures.

The features, functions, and advantages can be achieved independently in various embodiments of the present inventions or may be combined in yet other embodiments.

DRAWINGS

Figure 2:
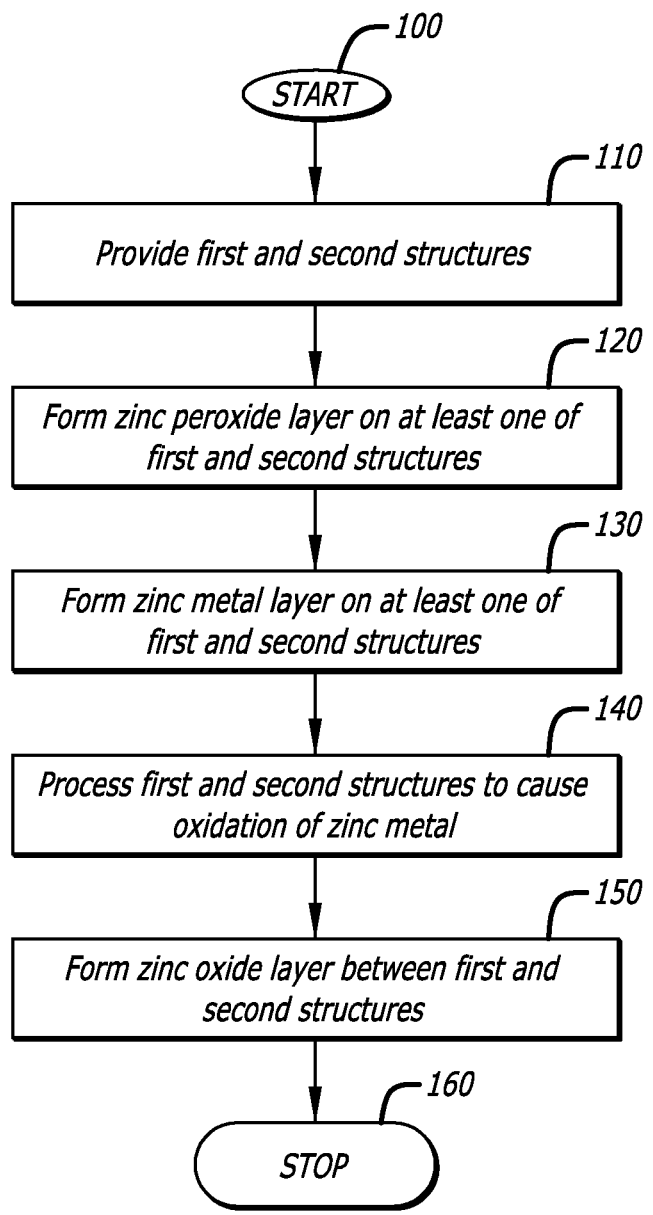

These and other features, aspects, and advantages of the present disclosure will become better understood with regard to the following description, appended claims, and accompanying drawings where:

FIG. 1 shows an illustration of a bonding process between two structures to form a layered bonded structure; and FIG. 2 shows a method of forming a layered bonded structure.

DESCRIPTION

The methods and apparatus disclosed herein provide a system for bonding of layered structures in applications, particularly applications employing layered wafers, such as in semiconductors and other materials such as layered ceramics, layered metals, layered composites. Specifically, this system provides for bonding between layered structures by forming a zinc oxide layer that bonds the structures together. The zinc oxide results from a reaction occurring between zinc metal and zinc peroxide, wherein the zinc metal and zinc peroxide are provided in layers on the structures.

Certain processing techniques require bonding of layered materials with a high-transparency and highly conductive medium, such as zinc oxide, between the layers. In previous methods, bonding processes employed materials such as: 1) thin metallic interface layers; 2) thin polymer film; 3) transparent conducting oxides with direct oxide bonding mechanisms; 4) heavily-doped III-V interface layers; and 5) transparent carbon nanotube films. Methods employing these materials, however, presented various limitations. For example, the layers had to be highly polished or required high levels of energy for processing.

To help minimize such limitations in bonding layers together, the present method takes advantage of the low melting temperature of zinc to initiate oxygen bonding in zinc metal and convert the zinc metal into zinc oxide. The oxygen required for zinc oxide formation comes from zinc peroxide and, if needed, added oxygen gas. The use of zinc metal allows flexibility and higher tolerance in surface topography of the host layered materials prior to bonding, such that this approach presents a high-yield integration scheme.

In the following description, numerous details are set forth in order to provide a more thorough description of the system. It will be apparent, however, to one skilled in the art, that the disclosed system may be practiced without these specific details. In the other instances, well-known features have not been described in detail so as not to unnecessarily obscure the system.

The invention is a processing system and method to bond layered materials using transparent conductive zinc oxide (ZnO) produced through oxidation and reactive bonding of zinc metal (Zn) and zinc peroxide ($ZnO_2$), resulting in a bonded structure formed from the layered materials and the zinc oxide. FIG. 1 shows a schematic illustration of the proposed hybrid zinc oxide bonding approach between a first structure 10 and a second structure 20. In the illustrated embodiment, the first and second structures 10, 20 provided are first and second wafers 10, 20. In other embodiments, the first and second structures may include one or both of a particular device or a handle in a layered unit. In further embodiments, one or both of the structures may be photovoltaic and/or include a solar cell.

The first and second wafers 10, 20 may include materials such as silicon, crystalline silicate, gallium arsenide, indium phosphide, gallium phosphide, aluminum gallium arsenide, and indium gallium arsenide. Because a layer of zinc peroxide is deposited on the first and second wafers 10, 20, as discussed in further detail below, the compatibility of the materials forming the first and second wafers 10, 20 is less impactful, because these materials may not necessarily contact each other during the bonding process. As such, there is greater flexibility to include a wider variety of materials in the first and second wafers 10, 20.

To further describe the bonding process, material containing zinc peroxide is deposited on the first and second wafers 10, 20, forming a zinc peroxide layer 30, as shown in the illustrated embodiment. The zinc peroxide layer 30 may be transparent and/or conductive. In an alternative embodiment, the zinc peroxide layer 30 is deposited on only one of the first and second wafers 10, 20. The zinc peroxide layer 30 may be deposited under atmospheric pressure and thus does not necessarily require vacuum systems or other pressure-altering systems, as with other wafer-bonding applications. Also, the zinc peroxide layer 30 may be deposited using a plasma-enhanced tool or other tool commonly used in the field.

Following the application of the zinc peroxide layer 30, a zinc metal layer 40 is then formed on one or both of the first and second wafers 10, 20. In the illustrated embodiment, the zinc metal layer 40 is deposited over the zinc peroxide layer 30 on both of the first and second wafers 10, 20. In an alternative embodiment, the zinc metal layer 40 may be deposited over one of the first and second wafers 10, 20 that does not have a zinc peroxide layer 30 deposited thereon. The zinc metal layer 40 may have a thickness in the range of 10-100 nanometers (nm) or thicker. As with the zinc peroxide layer 30, the zinc metal layer 40 may be deposited under atmospheric pressure using a plasma-enhanced tool or other tool commonly used in the field.

After the zinc metal layer 40 is deposited on the first and/or second wafers 10, 20, the bonding process of the zinc metal with oxygen, i.e., oxidation of the zinc metal, is initiated. To proceed, pressure is applied to press the first and second wafers 10, 20 together. Consequently, the zinc peroxide and zinc metal layers 30, 40 are pressed together. The amount of pressure applied may be in the range of about 5 to 80 psi and can be as high as the host materials 10, 20 can withstand. In addition to applying pressure to the first and second wafers 10, 20, the first and second wafers 10, 20 are exposed to a temperature in the range of about 100-400° C. The temperature should be at a level sufficient to result in softening of the zinc metal. This may be considered a low temperature range in view of other wafer production methods, although higher temperatures may be applied. This method, however, takes advantage of the low temperatures at which melting and bonding of zinc metal can occur, such that the bonding process may be conducted at lower temperatures than those associated with other materials. This ability to conduct the process at such lower temperature ranges reduces the thermal stress in the bonding material as well as energy associated with the process.

The application of heat and pressure may occur in a time range of about 30 minutes to 3 hours or however long is necessary to achieve the desired effect. As heat and pressure are applied to the first and second wafers 10, 20, additional oxygen gas may also be distributed around the first and second wafers 10, 20 to promote further oxidation of the zinc metal.

The application of the described heat and pressure results in the reactions shown below:

$$2Zn + 2O \rightarrow 2ZnO \quad (1)$$

$$2ZnO_2 \rightarrow 2ZnO + 2O \quad (2)$$

$$Zn + ZnO_2 \rightarrow 2ZnO \quad (3)$$

In particular, the application of heat and pressure to the zinc metal layer 40 in the presence of oxygen causes the zinc metal to melt and further results in thermal oxidation of the zinc metal to form zinc oxide, as seen in equation (1). The oxidation rate may be enhanced by oxygen species production from a thermally-induced $ZnO_2$-to-$ZnO$ conversion reaction in the zinc peroxide layer 30, as seen in equation (2). A thermodynamic-based binary phase diagram (not shown) of zinc and oxygen also supports a $ZnO_2$-to-$ZnO$ conversion reaction at the described temperature. The net result from the reaction (1) and (2) is zinc oxide bonding, as shown in equation (3). The zinc oxide bonding process may be conducted until most or all of the zinc peroxide has undergone the reaction leading to zinc oxide. The amount of zinc peroxide remaining may be reduced or eliminated as preferred, depending on the application and function of the first and second wafers 10, 20. To verify the extent to which zinc oxide bonding has occurred, the amount of zinc oxide between the first and second wafers 10, 20 may be determined by detection processes known in the art, such as x-ray diffraction and secondary ion mass spectrometry. Tests may also be conducted for resistance and optical transparency of zinc oxide at specific wavelengths in comparison with known parameters for zinc oxide. The zinc oxide bonding process thus results in a layer of zinc oxide 50 that in turn bonds the first and second wafers 10, 20 together, forming a unitary layered bonded structure 60. Note that complete oxidation of Zn metal film may not be necessary in applications that do not require high optical transparency.

A summary view of the process is shown in FIG. 2. The process is first started (step 100), and the first structure 10 and second structure 20 are provided (step 110). The zinc peroxide layer 30 is formed on at least one of the first and second structures 10, 20 (step 120). A zinc metal layer 40 is then formed on at least one of the first and second structures 10, 20 (step 130). The first and second structures 10, 20 are then contacted and processed under pressure and heat to cause oxidation of the zinc metal (step 140). A zinc oxide layer 50 is then formed between the first and second structures 10, 20 that bonds the first and second structures 10, 20 together (step 150). The process may then be ended (step 160).

Notably, this bonding approach for zinc oxide conversion relaxes the surface roughness requirement required by other types of bonding. Specifically, other types of bonding procedures, such as direct wafer bonding in which no additional material is layered on the wafers, require that the bonding surfaces are very smooth with minimal surface irregularities. This may require a significant amount of production time dedicated to treating the bonding surfaces to achieve the desired reduction of surface irregularities through chemical-mechanical polishing and/or other surface treatment steps prior to the bonding process. This bonding process may also provide high yield. In particular, transparent conductive zinc oxide bonding materials, including zinc peroxide, adhere to many different materials, allowing for a variety of material combinations for bonding. Further, the bonded zinc oxide provides for increased mechanical strength with reduced electrical resistance. Zinc oxide also provides optical transparency at certain wavelengths.

One area in particular for which the present bonding process may be utilized is solar cell technology, or semiconductor-bonded technology, which has produced solar cells with high space cell efficiency. In this technology, high cell efficiency depends significantly on the bond quality of gallium arsenide-based solar cells and indium phosphide-based solar cells. Since the present process reduces requirements for surface preparation and material compatibility inherent in other processes, semiconductor-bonded solar cell designs can be produced with additional degrees of freedom, more varieties of materials, and higher efficiencies. For example, on the photovoltaic module level, a solar cell can be bonded to metal or ceramic or light-weight handles. In addition, the ability to accommodate various other solar cell materials, such as crystalline silicate, copper indium selenide, and indium gallium nitride, allows for reduced material and integration costs for high-efficiency solar cell designs. The described bonding process may also be used for any other technology that requires transparent conductive bonding.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

I claim:

1. A bonded layered structure, comprising:
    a first structure comprising a semiconductor and a second structure comprising a semiconductor; and
    a first layer comprising zinc oxide between the first and second structures that contacts both the first and second structures,
    wherein the first layer of zinc oxide is formed from oxidation of a second layer of zinc metal on at least one of the first and second structures in contact with a third layer of zinc peroxide on at least one of the first and second structures, and
    wherein at least one of the first or second structures is photovoltaic.

2. The layered structure of claim 1, wherein the zinc oxide is formed from exposing the first and second structures to a temperature in the range of about 100-400° C.

3. The layered structure of claim 1, wherein the zinc oxide is formed from contacting the first and second structures by applying pressure in the range of about 5 to 80 psi.

4. The layered structure of claim 1, wherein the zinc oxide is formed from oxygen gas provided to the first and second structures.

5. The layered structure of claim 1, wherein at least one of the first and second structures comprises a wafer.

6. The layered structure of claim 1, wherein the semiconductor is a crystalline semiconductor.

7. The layered structure of claim 1, wherein at least one of the first and second structures comprises gallium arsenide or indium phosphide.

8. The layered structure of claim 1, wherein at least one of the first and second structures comprises a solar cell.

9. The layered structure of claim 8, wherein at least one of the first and second solar cells is bonded to at least one of a metal, a ceramic, or a light-weight handle.

10. The layered structure of claim 5, wherein the at least one of the first and second wafers comprises silicon, crystalline silicate, gallium arsenide, indium phosphide, gallium phosphide, aluminum gallium arsenide, or indium gallium arsenide.

11. The layered structure of claim 5, wherein the at least one of the first and second wafers comprises crystalline silicate, copper indium selenide, or indium gallium nitride.

12. A bonded layered structure, comprising:
    a first wafer comprising a semiconductor and a second wafer comprising a semiconductor; and
    a first layer comprising zinc oxide between the first and second wafers that contacts both the first and second wafers,
    wherein the first layer of zinc oxide is formed from oxidation of a second layer of zinc metal on at least one of the first and second wafers in contact with a third layer of zinc peroxide on at least one of the first and second wafers, and
    wherein at least one of the first or second wafers is photovoltaic.

13. The layered structure of claim 12, wherein the at least one of the first and second wafers comprises silicon, crystalline silicate, gallium arsenide, indium phosphide, gallium phosphide, aluminum gallium arsenide, or indium gallium arsenide.

14. The layered structure of claim 12, wherein the at least one of the first and second wafers comprises crystalline silicate, copper indium selenide, or indium gallium nitride.

15. The layered structure of claim 12, wherein the zinc oxide is formed from exposing the first and second wafers to a temperature in the range of about 100-400° C.

16. The layered structure of claim 12, wherein the zinc oxide is formed from contacting the first and second wafers by applying pressure in the range of about 5 to 80 psi.

17. The layered structure of claim 12, wherein the zinc oxide is formed from oxygen gas provided to the first and second wafers.

18. The layered structure of claim 12, wherein the semiconductor is a crystalline semiconductor.

19. The layered structure of claim 12, wherein at least one of the first and second wafers comprises a solar cell.

20. The layered structure of claim 19, wherein at least one of the first and second solar cells is bonded to at least one of a metal, a ceramic, or a light-weight handle.

* * * * *